(12) United States Patent
Cheng

(10) Patent No.: US 10,756,192 B2
(45) Date of Patent: Aug. 25, 2020

(54) SEMICONDUCTOR DEVICE AND METHOD FOR MANUFACTURING THE SAME

(71) Applicant: TAIWAN SEMICONDUCTOR MANUFACTURING COMPANY LIMITED, Hsin-Chu (TW)

(72) Inventor: Kai-Yu Cheng, New Taipei (TW)

(73) Assignee: TAIWAN SEMICONDUCTOR MANUFACTURING COMPANY LIMITED, hsin-chu (TW)

( * ) Notice: Subject to any disclaimer, the term of this patent is extended or adjusted under 35 U.S.C. 154(b) by 0 days.

(21) Appl. No.: 16/205,395

(22) Filed: Nov. 30, 2018

(65) Prior Publication Data

US 2019/0103469 A1 Apr. 4, 2019

Related U.S. Application Data

(60) Continuation of application No. 15/791,362, filed on Oct. 23, 2017, now Pat. No. 10,164,035, which is a
(Continued)

(51) Int. Cl.
*H01L 29/417* (2006.01)
*H01L 29/78* (2006.01)
(Continued)

(52) U.S. Cl.
CPC .. *H01L 29/41791* (2013.01); *H01L 21/76802* (2013.01); *H01L 21/76841* (2013.01);
(Continued)

(58) Field of Classification Search
None
See application file for complete search history.

(56) References Cited

U.S. PATENT DOCUMENTS 7,687,395 B2 * 3/2010 Yang ............... H01L 21/76897
438/638
7,696,578 B2 * 4/2010 Chen ............... H01L 21/823807
257/369
(Continued)

FOREIGN PATENT DOCUMENTS

CN 101872742 A 10/2010
CN 103855077 A 6/2014
(Continued)

OTHER PUBLICATIONS

Corresponding Chinese Patent Application No. 201611114382.6, Office Action dated Sep. 16, 2019.

*Primary Examiner* — Steven M Christopher
(74) *Attorney, Agent, or Firm* — Cooper Legal Group, LLC

(57) ABSTRACT

A semiconductor device having a composite barrier structure over a transistor and a method for manufacturing the same is disclosed. The method includes a series of steps including: forming a transistor having source/drain regions within a fin structure and adjacent to a gate structure across over the fin structure; forming first source/drain contacts right above and electrically connected to the source/drain regions; depositing a composite barrier structure over the transistor and the first source/drain contacts; and forming second source/drain contacts right above and electrically connected to the first source/drain contacts. The method further includes depositing a second etch-stop layer before depositing the composite barrier structure and forming second source/drain contacts right above and electrically connected to the first source/drain contacts. The method also includes forming contacts over and electrically connected to the second source/drain contacts.

20 Claims, 9 Drawing Sheets

Related U.S. Application Data division of application No. 15/053,499, filed on Feb. 25, 2016, now Pat. No. 9,799,741.

(60) Provisional application No. 62/268,434, filed on Dec. 16, 2015.

(51) Int. Cl.
  *H01L 29/66* (2006.01)
  *H01L 21/768* (2006.01)
  *H01L 23/31* (2006.01)
  *H01L 29/49* (2006.01)

(52) U.S. Cl.
  CPC .... *H01L 21/76877* (2013.01); *H01L 23/3171* (2013.01); *H01L 29/4966* (2013.01); *H01L 29/66795* (2013.01); *H01L 29/7851* (2013.01)

(56) References Cited

U.S. PATENT DOCUMENTS

| | | | | |
|---|---|---|---|---|
| 9,412,656 | B2* | 8/2016 | Fu | H01L 21/76879 |
| 2012/0187460 | A1* | 7/2012 | Lavoie | H01L 29/665 257/288 |
| 2013/0187228 | A1 | 7/2013 | Xie et al. | |
| 2015/0187905 | A1* | 7/2015 | Cai | H01L 29/6681 257/288 |
| 2015/0318180 | A1 | 11/2015 | Rim et al. | |
| 2016/0056083 | A1* | 2/2016 | Do | H01L 21/823431 438/299 |
| 2016/0071799 | A1* | 3/2016 | Hsieh | H01L 21/82387 257/288 |
| 2016/0351669 | A1* | 12/2016 | Shiao | H01L 29/4175 |
| 2017/0133485 | A1* | 5/2017 | Cohen | H01L 29/7856 |

FOREIGN PATENT DOCUMENTS

| | | |
|---|---|---|
| CN | 104835743 A | 8/2015 |
| TW | 200917478 A | 4/2009 |
| TW | 201239991 A | 10/2012 |
| TW | 201423907 A | 6/2014 |
| TW | 201533911 A | 9/2015 |

* cited by examiner

SEMICONDUCTOR DEVICE AND METHOD FOR MANUFACTURING THE SAME

RELATED APPLICATIONS

This application is continuation of and claims priority to U.S. Non-Provisional application Ser. No. 15/791,362, titled "SEMICONDUCTOR DEVICE AND METHOD FOR MANUFACTURING THE SAME" and filed on Oct. 23, 2017, which is a divisional of and claims priority to U.S. Non-Provisional application Ser. No. 15/053,499, titled "SEMICONDUCTOR DEVICE AND METHOD FOR MANUFACTURING THE SAME" and filed on Feb. 25, 2016, which claims priority to U.S. Provisional Application Ser. No. 62/268,434, titled "FINFET BARRIER STOP LAYER FOR VIA TO METAL GATE SHORT IMPROVEMENT" and filed on Dec. 16, 2015. U.S. Non-Provisional application Ser. No. 15/791,362, U.S. Non-Provisional application Ser. No. 15/053,499, and U.S. Provisional Application Ser. No. 62/268,434 are incorporated herein by reference.

BACKGROUND

Semiconductor devices are widely used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits (ICs). With dimension scaling down to increase integration density of the ICs, requirements in the processing and manufacturing of semiconductor device have become more complex for providing the ICs with multi-functions and advanced performances.

To address the issues in the increase of manufacturing complexity and the accompanied problems in manufacturing processes, it is necessary to advance IC processing and manufacturing. For example, vertical transistors, e.g., a fin field-effect transistor (FinFET), were applied with the same gate length in the semiconductor devices but higher integration density in view of typical planar transistors. However, gate length and channel length of the vertical transistor are much less than that of the horizontal transistor, which increases leakage current and significantly reduce reliability. Further improvements are constantly necessary to satisfy the performance requirement of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
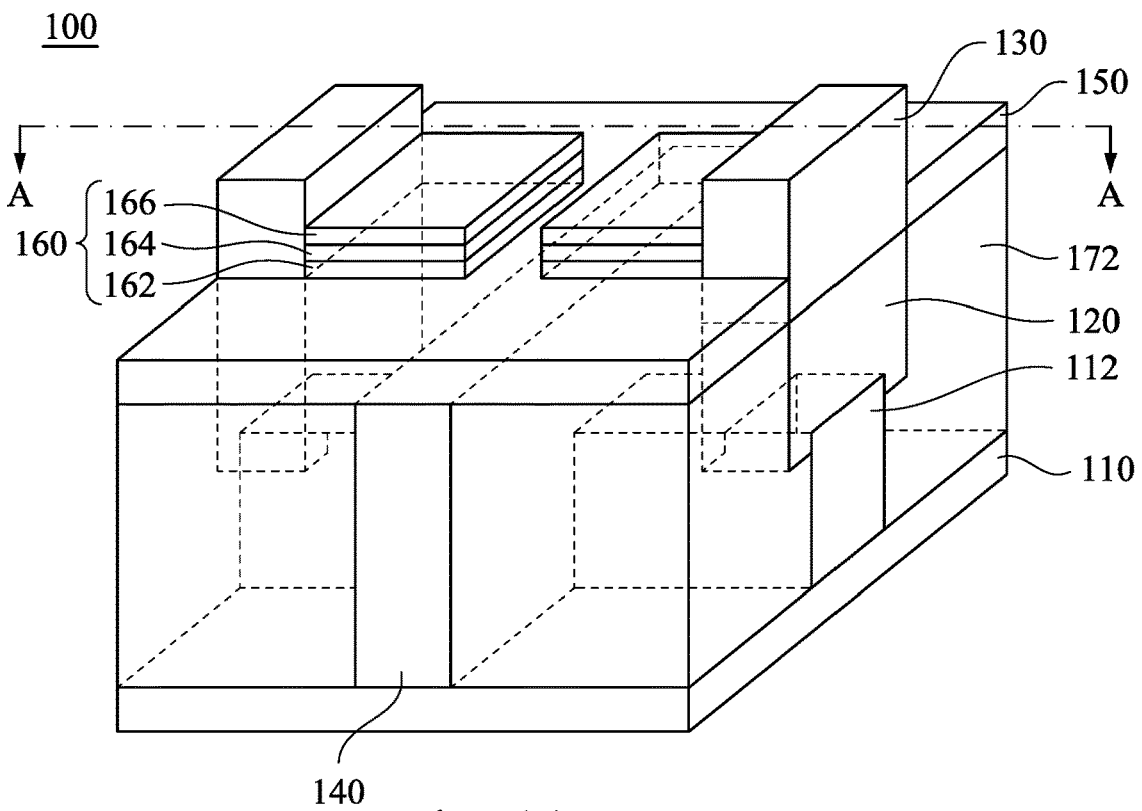
FIG. 1A and FIG. 1B illustrate a three-dimensional view and a cross-sectional view of a FinFET device respectively in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

In manufacturing processes of a semiconductor device, it is very important for an integrated circuit to operate in a stable condition, thus any possibility of causing short circuit should be avoided. In a fin field-effect transistor (FinFET), one of such short circuit may occur between a gate structure over a fin structure and a source/drain contact electrically connected to a source/drain region in the fin structure adjacent to the gate structure. In a normal manufacturing process, during forming a contact over and electrically connected to the source/drain contact, a removing process such as wet etching is performed to remove a portion of a dielectric layer over the source/drain contact to form a via hole in a desired shape for the contact formed subsequently. However, in a traditional way to form the via hole by the etching process, due to an etching loading effects, the dielectric layer is prone to be over-etched so that the gate structure is exposed despite of the existence of a contact etch stop layer disposed over the gate structure. A formed via hole resulted from the over-etched dielectric layer is then filled with a conductive material to form the contact that causes a short circuit between the gate structure and the source/drain contact. The aforementioned etching loading effects comprise a shifted overlap between the via hole and the source/drain contact, a shrinkage of the source/drain contact, and a large critical dimension (CD) of the via hole. It should be noticed that the etching loading effects mentioned above is not easily to be eliminated to avoid the over-etching of the dielectric layer and the short circuit between the gate structure and the source/drain contact.

To solve the problem of short circuit between the gate structure and the source/drain contact that is caused by the via hole in the dielectric layer exposing both the gate structure and the source/drain contact, a method is provided to prevent the via hole in the dielectric layer from exposing the gate structure. In the method, a composite barrier structure (or called diffusion barrier layer) is formed over the contact etch stop layer and around the source/drain contact to provide further protection for the gate structure during the etching process for forming the contact (or called contact etching). In comparison to the traditional ways of forming the contact, the composite barrier structure makes the via hole stopped therein so that the gate structure, even the contact etch stop later, remains intact rather than exposed.

It should be noticed that following embodiments will be described in relation to a specific context, a FinFET device. However, the following and other embodiments may also be applied to other transistor devices, such as tubular FET, metal oxide semiconductor field effect transistor (MOSFET), thin film transistor (TFT), and bases or emitters of a bipolar complementary metal oxide semiconductor (BC-MOS) device, with a goal of increased protection of gate structures.

Figure 1B:
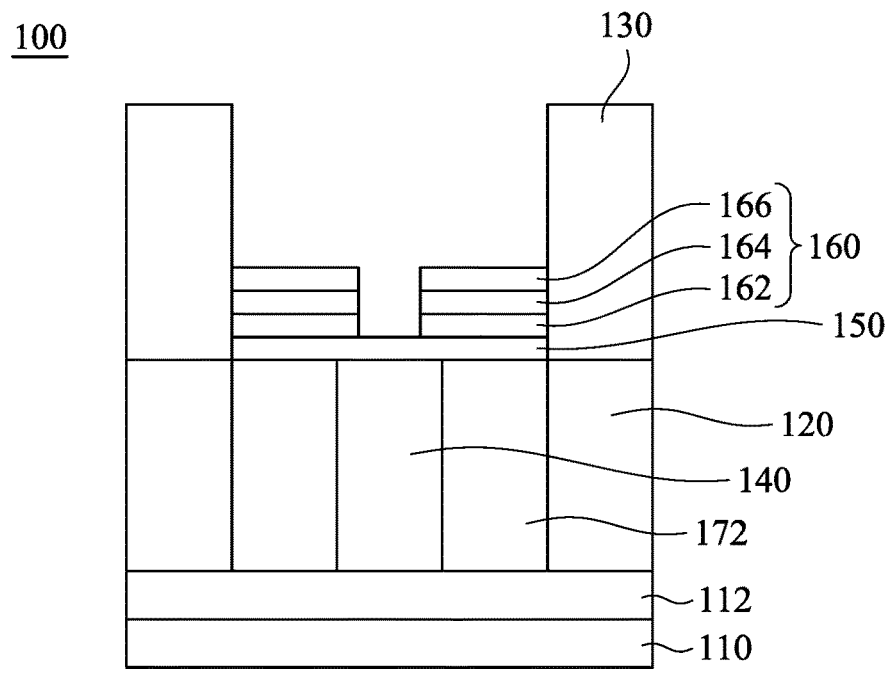

FIG. 1A and FIG. 1B illustrate a three-dimensional view and a cross-sectional view of a FinFET device 100 at an intermediate stage of a manufacturing process respectively, wherein FIG. 1B illustrates the cross-sectional view of the FinFET device 100 along line A-A in FIG. 1A. The FinFET device 100 comprises a transistor including a fin structure 112 extending above a substrate 110, a gate structure 140 across over the fin structure, and a source/drain region (not shown) within the fin structure 112 and adjacent to the gate structure. The position of the source/drain region is right below a first source/drain contact, which will be mentioned afterward. The source/drain region is not shown in the figures for simplicity and easier understanding of the present disclosure. The FinFET device 100 further comprises a first source/drain contact 120, a second source/drain contact 130, and a first dielectric layer 172.

The gate structure 140 is formed across over the fin structure 112 and may comprise a gate dielectric layer (not shown) between the gate structure 140 and the fin structure 112. The second source/drain contact 130 is formed over and electrically connected to the first source/drain contact 120, and the first source/drain contact 120 is formed over and electrically connected to the source/drain region. The second source/drain contact 130 may electrically connect the source/drain region to external devices and/or subsequently formed layers, such as an interconnect structure. In addition, the FinFET device 100 comprises an etch stop layer 150 over the gate structure 140 and adjacent to the second source/drain contact 130. As one skilled in the art knows, the etch stop layer 150 is used as a contact etch stop layer or a passivation layer covering a source/drain contact and a gate structure thereunder. It should be noticed that although the FinFET device 100, shown in FIGS. 1A and 1B, has the etch stop layer 150, in some embodiments, the FinFET device may not have the etch stop layer 150.

As shown in FIGS. 1A and 1B, a composite barrier structure 160 is formed over the etch stop layer 150 and adjacent to the second source/drain contact 130. In addition, a dielectric layer (not shown in FIGS. 1A and 1B for simplicity and easier understanding of the present disclosure but shown in cross-sectional views of semiconductor devices during manufacturing process, for example, a second dielectric layer 174 in FIG. 8) is formed over the etch stop layer 150 and the composite barrier structure 160. Compared to a traditional FinFET device without an additional composite barrier structure over an etch stop layer (i.e. a contact etch stop layer), the composite barrier structure 160 in the present disclosure provides further protection for the gate structure 140 during a contact etching process for forming a contact over and electrically connected to the second source/drain contact 130. In other words, during a subsequent process of forming the contact over the second source/drain contact 130, the composite barrier structure 160 can prevent a via hole, formed by the contact etching process, from exposing the gate structure 140, which leads to a short circuit between the gate structure 140 and the second source/drain 130 after filling the via hole with a conductive material to form the contact.

Figure 2:
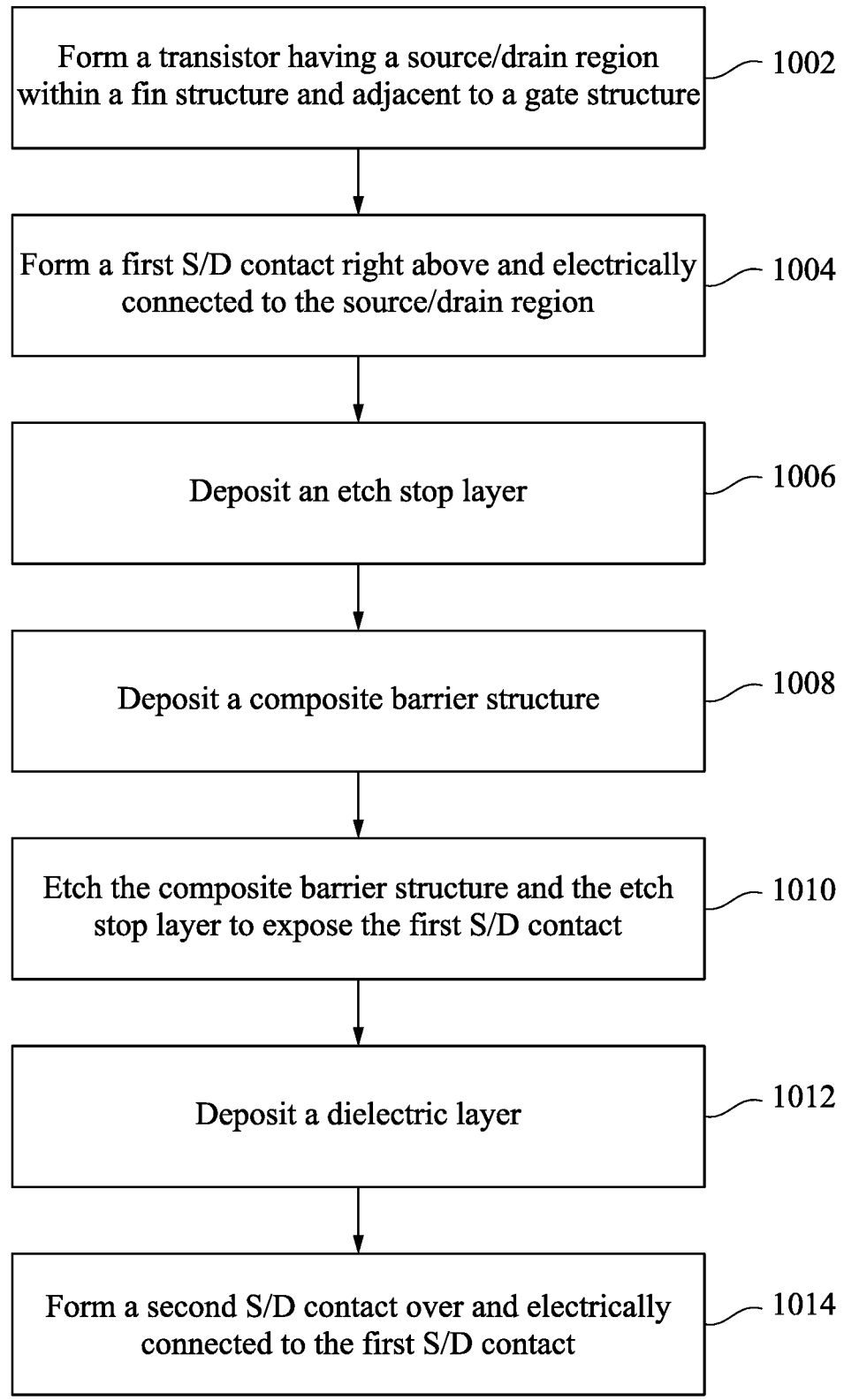
FIG. 2 illustrates a flow chart of an exemplary method for manufacturing a FinFET device in accordance with some embodiments.

Now referring to FIG. 2, which is an exemplary flow chart for manufacturing the FinFET device 100 according to one embodiment of the present disclosure. The flow chart illustrates only a relevant part of the entire manufacturing process. It is understood that additional operations may be provided before, during, and after the operations shown by FIG. 2, and some of the operations described below can be replaced or eliminated for additional embodiments of the method. The order of the operations/processes may be interchangeable. For example, as described before, the step 1006 of depositing the etch stop layer 150 can be eliminated and directly proceeding to step 1008 of depositing the composite barrier structure 160.

As shown in FIG. 2, according to an embodiment, a method 1000 for manufacturing the FinFET device 100 as shown in FIGS. 1A and 1B is provided. The method 1000 comprises a series of steps. In step 1002, a transistor is formed over a substrate, wherein the transistor has a source/drain region within a fin structure and adjacent to a gate structure. In step 1004, a first S/D contact is formed right above and electrically connected to the source/drain region. In step 1006, an etch stop layer is deposited. In step 1008, a composite barrier structure is deposited. In step 1010, the composite barrier structure and the etch stop layer are etched to expose the first S/D contact. In step 1012, a dielectric layer is deposited. In step 1014, a second S/D contact is formed over and electrically connected to the first S/D contact.

Figure 3A:
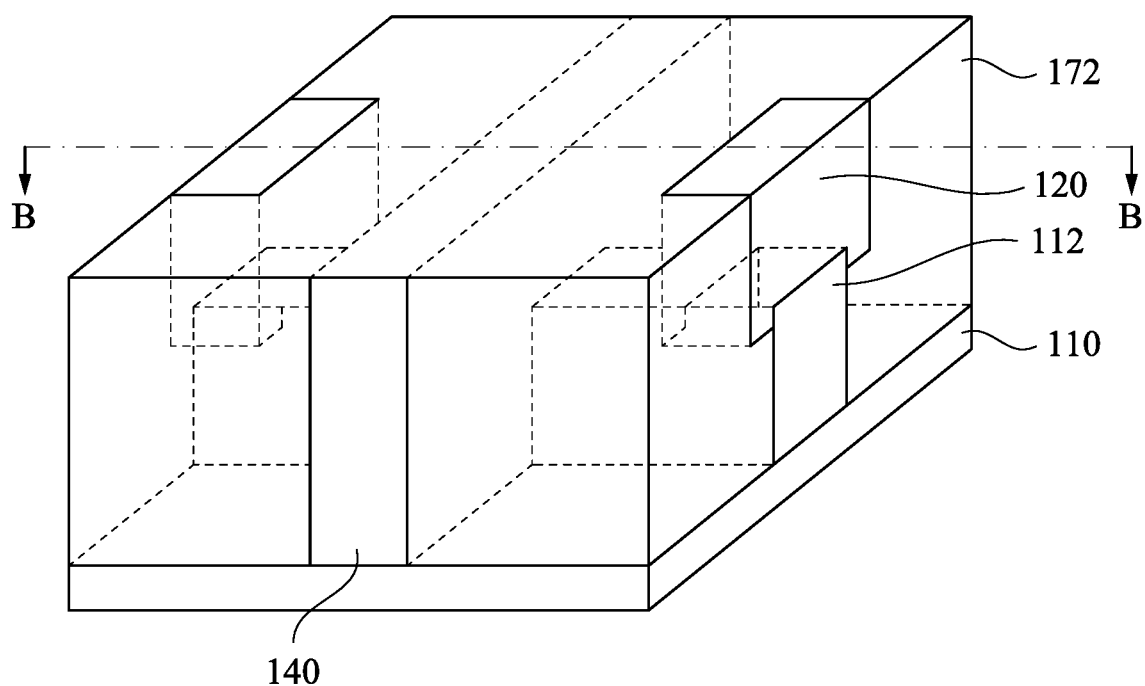
FIG. 3A and FIG. 3B illustrate a three-dimensional view and a cross-sectional view of an initial device used for manufacturing a FinFET device in accordance with some embodiments.
Figure 3B:
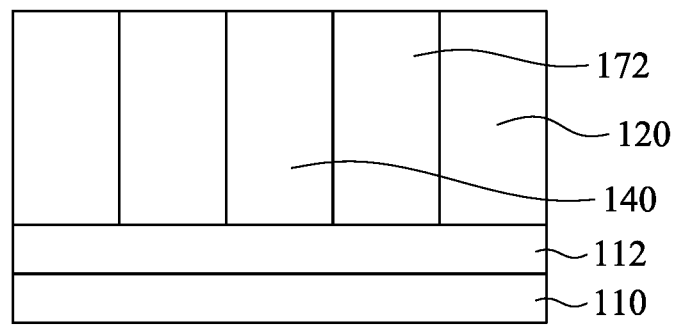
Figure 9:
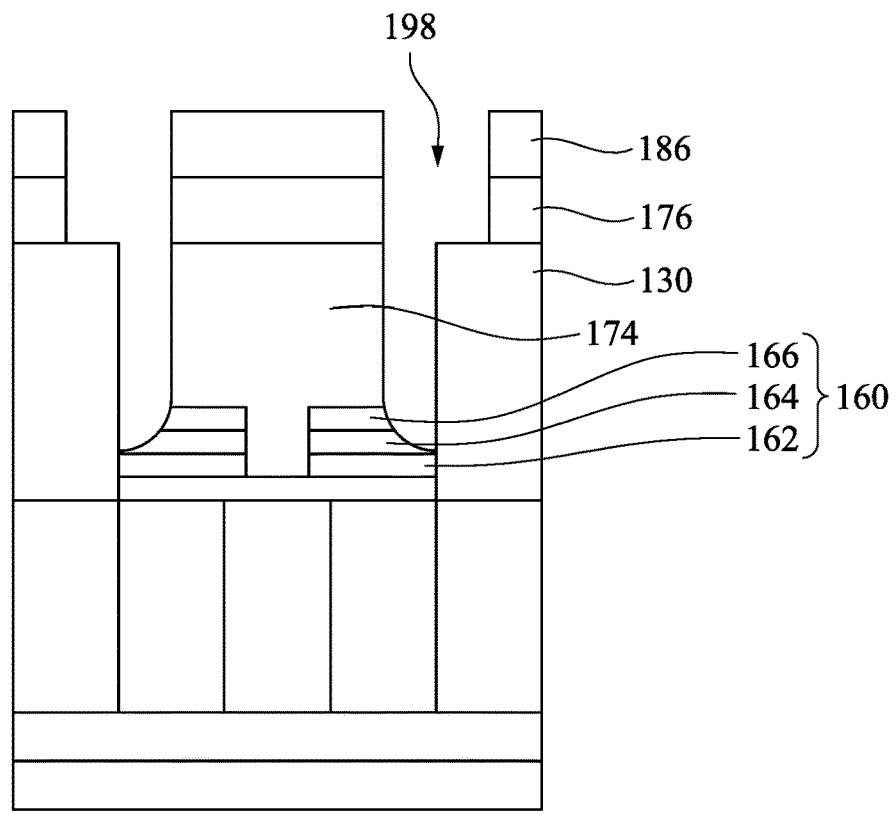
Figure 10:
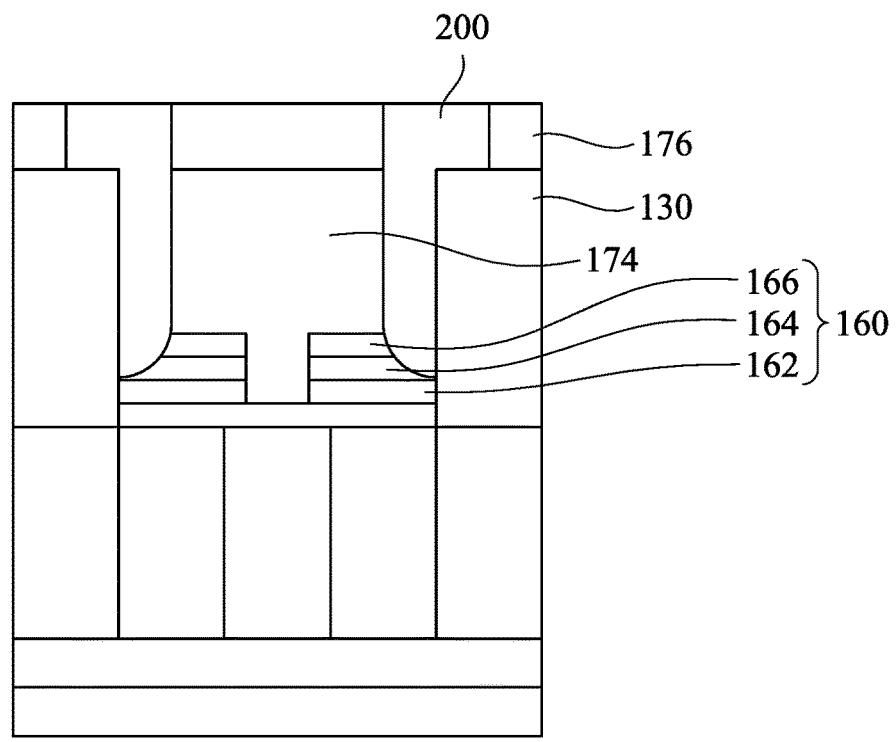

FIG. 3A and FIG. 3B illustrate a three-dimensional view and a cross-sectional view of an initial device of the FinFET device 100 respectively. The FinFET device 100 will be formed by the method 1000 from the initial structure, and cross-sectional views of the FinFET device 100 at different manufacturing stages are shown in FIGS. 4 through 8, wherein FIGS. 3B through 8 illustrate the cross-sectional views along line B-B in FIG. 3A. Furthermore, subsequent processes for forming a contact are performed and cross-sectional views of FinFET device at different stages of forming the contact are shown in FIGS. 9 and 10.

Referring to FIGS. 2, 3A, and 3B, the method 1000 starts from step 1002 by forming a transistor over a substrate, the transistor having a source/drain region within a fin structure and adjacent to a gate structure. Followed by step 1004 to form a first S/D contact right above and electrically connected to the source/drain region. As described before in FIG. 1A and FIG. 1B, the transistor comprises the fin structure 112 extending above the substrate 110, the gate structure 140 formed across over the fin structure 112, and the source/drain region (not shown) formed within the fin structure 112 and adjacent to the gate structure 140. The initial device in FIGS. 3A and 3B further comprises the first source/drain contact 120 over and electrically connected to the source/drain region and the first dielectric layer 172. Detailed information related to these elements is discussed below respectively.

Still referring to FIGS. 3A and 3B, the substrate 110 may be a bulk silicon substrate. Alternatively, the substrate 110 may comprise other types of semiconductors: an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrates 110 may also include a silicon-on-insulator (SOI) substrate. Other substrates that may be used include multi-layered substrates, gradient substrates, or hybrid orientation substrates. In the embodiment, the substrate 110 is a bulk silicon substrate. That is to say, fin structure 112 is physically connected to and supported by the substrate 110.

Still referring to FIGS. 3A and 3B, the gate structure 140 is formed across over the fin structure 112. The gate structure 140 comprises a gate oxide layer (not shown) between the gate structure 140 and the fin structure 112. The gate structure 140 comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. While, the gate oxide layer comprises LaO, AlO, ZrO, TiO, $SiO_2$, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. In some embodiments, the gate structure 140 and the gate oxide layer are formed by a deposition process, such as chemical vapor deposition (CVD) or a physical vapor deposition (PVD).

Still referring to FIGS. 3A and 3B, the source/drain region (not shown) is formed within the fin structure and adjacent to the gate structure 140. In addition, the first source/drain 120 is formed right above and electrically connected to the source/drain region (not shown). The source/drain region (not shown) in the fin structure 112 can be either a P-type doped region or a N-type doped region. In some embodiments, the P-type doped region is doped with a P-type dopant such as boron (B), gallium (Ga), and indium (In) by ion implantation. In some embodiments, the N-type doped region is doped with a N-type dopant such as phosphorus (P) and arsenic (As) by ion implantation. Furthermore, the first source/drain contact 120 comprises a material similar to a material of the gate structure 140 mentioned above, and the method for forming the first source/drain contact 120 is similar to the gate structure 140 as well.

Still referring to FIGS. 3A and 3B, the first dielectric layer 172 functions as an insulating layer or an isolation layer for separating one conductive element, such as source/drain region, the first source/drain contact 120, or the gate structure 140, from another one. The first dielectric layer 172 may comprise any suitable insulating materials such as, for example but not limited to, silicon oxide ($SiO_2$), silicon nitride (SiN), silicon oxynitride (SiON), fluoride-doped silicate glass, a low-k dielectric material, and a combination thereof. As used herein, the term "low-k dielectric" refers to the material having a dielectric constant, k, smaller than about 3.9, which is the k value of $SiO_2$. The first dielectric layer 172 may also comprise flowable material such as, for example, silicate, siloxane, methyl SilsesQuioxane (MSQ), hydrogen SisesQuioxane (HSQ), MSQ/HSQ, perhydrosilazane (TCPS), perhy-dro-polysilazane (PSZ), a tetraethyl orthosilicate (TEOS), or a silyl-amine, such as trisilylamine (TSA).

Figure 4:
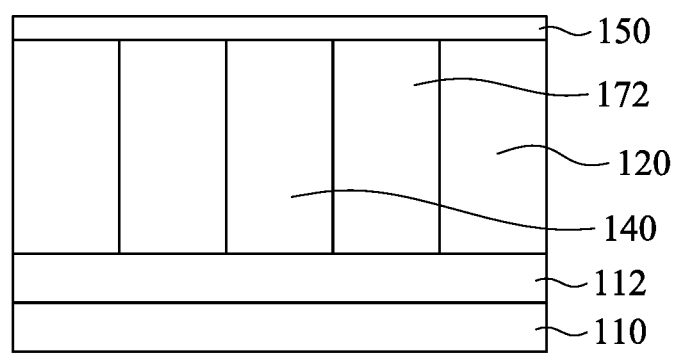
FIGS. 4 through 10 illustrate three-dimensional views and cross-sectional views of a FinFET device at various stages of manufacturing processes in accordance with some embodiments.

Referring to FIGS. 2 and 4, the method 1000 proceeds to step 1006 by depositing an etch stop layer. As shown in FIG. 4, an etch stop layer 150 is formed over top surfaces of the first dielectric layer 172, the first source/drain contact 120 and the gate structure 140, thus the etch stop layer 150 is commonly called a contact etch stop layer (CESL). In some embodiments, the etch stop layer 150 may comprise silicon nitride, silicon oxide, silicon carbide, or a combination thereof. In some embodiments, the etch stop layer 150 can be deposited by any suitable process such as CVD, high density plasma (HDP) CVD, sub-atmospheric CVD (SACVD), molecular layer deposition (MLD), plasma-enhanced chemical vapor deposition (PECVD), sputtering, or a combination thereof. In some embodiments, the etch stop layer 150 has a thickness in a range between about 90 Å and about 130 Å.

It should be noticed that, in some embodiments, the etch stop layer 150 is not deposited, namely, the step 1004 is not performed and directly continuing the following step 1008 to deposit a composite barrier structure over the top surface of the first dielectric layer 172, the first source/drain contact 120, and the gate structure 140. In some embodiments, as described below, the etch stop layer 150 is formed first, under, and physically connected to the composite barrier structure formed afterward.

Figure 5:
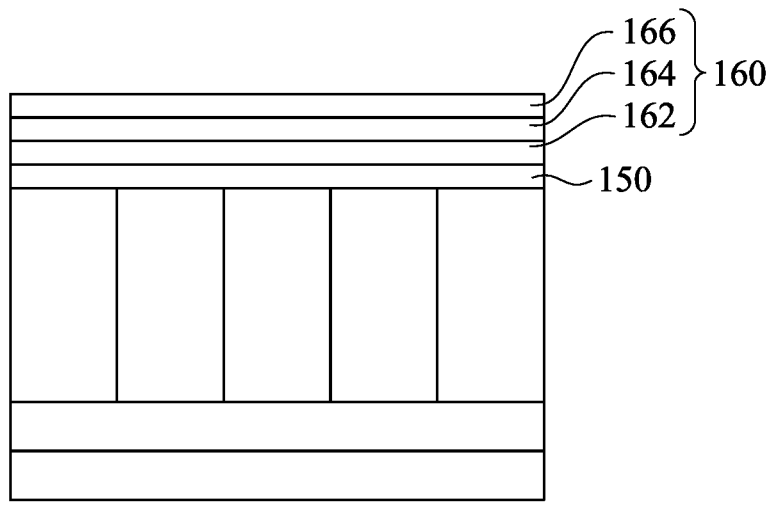

Referring to FIGS. 2 and 5, the method 1000 proceeds to step 1008 by depositing a composite barrier structure. As shown in FIG. 5, a composite barrier structure 160 is deposited over the etch stop layer 150. In some embodiments, the composite barrier structure 160 comprises multiple etch-stop layers. In the embodiment, the composite barrier structure 160 has a three-layer structure composed of an oxide layer 162 over the etch stop layer 150, a first nitride layer 164 over the oxide layer 162, and a second nitride layer 166 over the first nitride layer 164. In other embodiments, the composite barrier structure 160 may be a single layer structure of TiN. In some embodiments, the oxide layer 162 comprises any suitable oxide material, such as silicon oxide, silicon oxynitride, or a combination thereof. In some embodiments, the first nitride layer 164 and the second nitride layer 166 individually comprise a material independently selected form a group consisting of TiN, SiN or a combination thereof. For example, as the first nitride layer 164 is made of TiN, the second nitride 166 is made of SiN and vice versa.

In addition, the composite barrier structure 160 may be formed by any suitable deposition process such as atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering, and a combination thereof. Furthermore, thickness of each layer in the composite barrier structure 160 can be controlled by adjusting parameters of the deposition process. In some embodiments, the composite barrier structure 160 has a thickness in a range from about 150 Å to about 320 Å. In some embodiments, the oxide layer 162 has a thickness in a range between about 70 Å and about 100 Å. In some embodiments, the first nitride layer 164 has a thickness in a range between about 35 Å and about 100 Å. In some embodiments, the second nitride layer 166 has a thickness in a range between about 45 Å and about 120 Å. The formed composite barrier structure 160 provides a better protection for the gate structure 140 during contact etching, which will be discussed latter.

Figure 6:
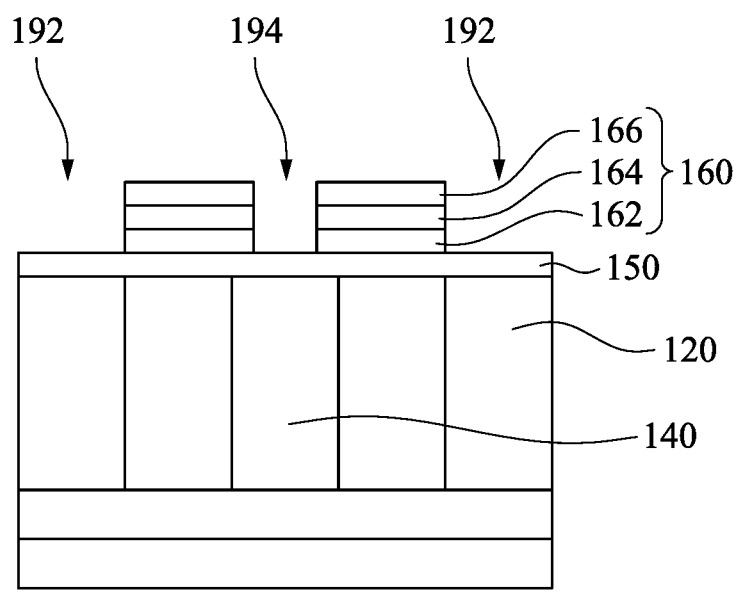

Referring to FIGS. 2 and 6, the method 1000 proceeds to step 1010 by etching the composite barrier structure 160 and the etch stop layer 150 to expose the first source/drain contact. As shown in FIG. 6, the composite barrier structure 160 and the etch stop layer 150 are etched to form a first via hole 192 exposing a top surface of the first source/drain contact 120 and a second via hole 194 exposing a top surface of the etch stop layer 150. In some embodiments, the etching process may comprise dry etching, wet etching, plasma etching, reactive-ion etching, or a combination thereof. The etching gas used in the etching process may comprise HBr, $CF_4$, $CHF_3$, $CH_4$, $CH_2F_2$, $N_2H_2$, $BCl_3$, $Cl_2$, $N_2$, $H_2$, $O_2$, He, Ar, or a combination thereof. In some embodiments, the second nitride layer 166, the first nitride layer 164, and the oxide layer 162 are etched respectively and sequentially. In other embodiments, the composite barrier structure 160 is etched at one time.

Figure 11:
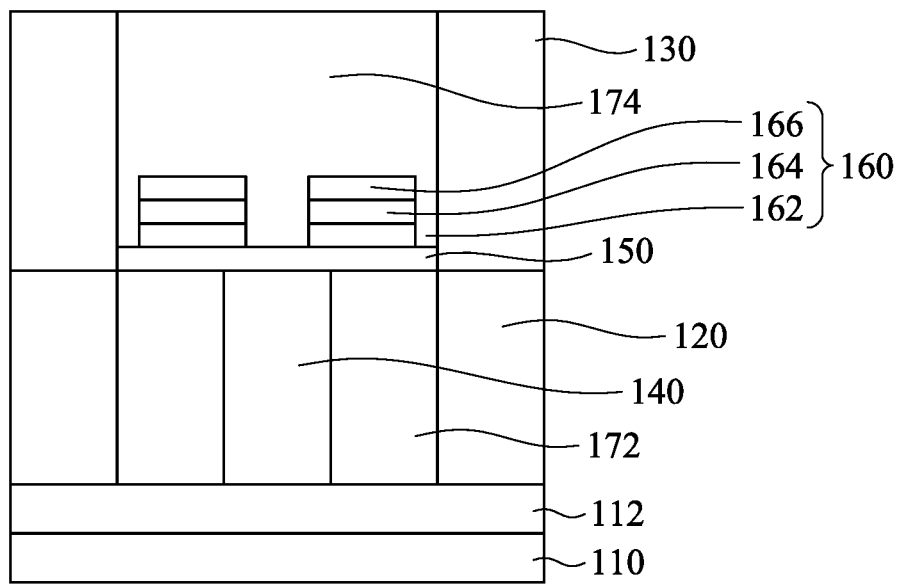
FIGS. 11 through 13 illustrate cross-sectional views of FinFET devices in accordance with some embodiments.
Figure 12:
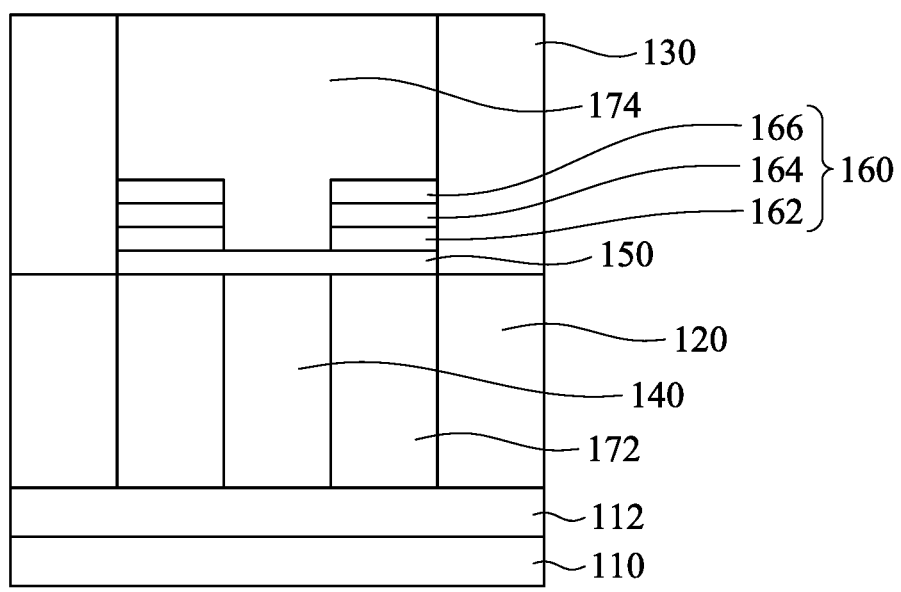
Figure 13:
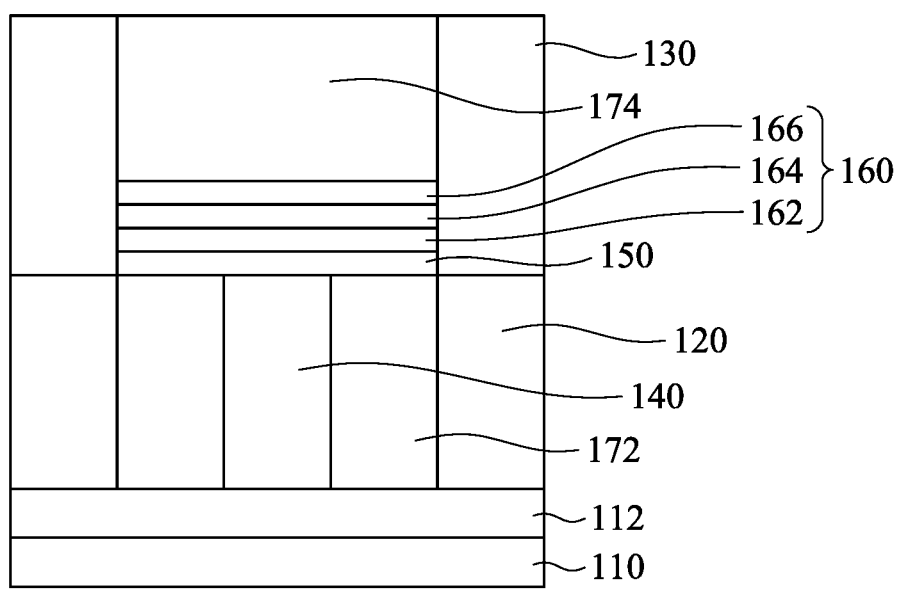

In addition, before the aforementioned etching process is performed, a lithography process is performed first to form a photo resist mask 182 over the composite barrier structure 160 to define a position of the first via hole 192 and the second via hole 194. In some embodiments, the lithography process may comprise forming a photo resist layer (not shown) over the composite barrier structure 160, exposing the photo resist layer to form a pattern, performing post-exposure bake processes, and developing the pattern to form a photo resist mask 182. By adjusting a position of the photo resist mask 182, a desired or predetermined-shape composite barrier structure 160 can be obtained. It should be noticed that the formed first via hole 192 define a position of the second source/drain contact 130 formed afterward, and the formed second via hole 194 define a position, a shape, or a length of the composite barrier structure 160. In the embodiment, the via hole 192 is right over the first source/drain contact 120 and has a same dimension and shape. In some embodiments, the first via hole 192 is larger than the first source/drain contact 120, which will be discussed latter in FIG. 11. In other embodiments, the first via hole 192 is smaller than the first source/drain contact 120. In the embodiments, the second via hole 194 covers a portion of the gate structure 140. In other embodiments, the via hole does not cover the gate structure 140, which will be discussed latter in FIG. 12. In other embodiments, the via hole covers all the gate structure 140, which will be discussed latter in FIG. 13.

Figure 7:
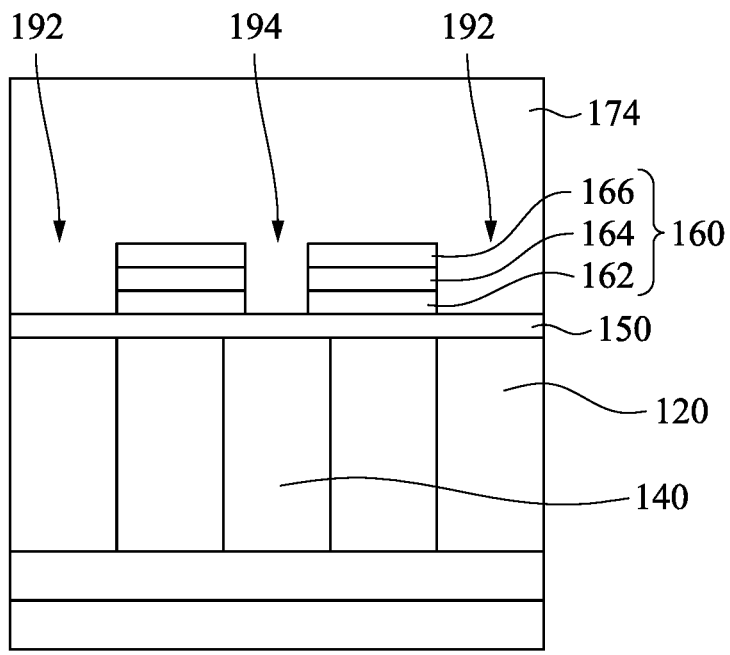

Referring to FIGS. 2 and 7, the method 1000 proceeds to step 1012 by depositing a dielectric layer. As shown in FIG. 7, a second dielectric layer 174 is deposited over the composite barrier structure and is filled into the first via hole 192 and the second via hole 194. The method and the material used for forming the second dielectric layer 174 are similar to the first dielectric layer 172 as described in FIGS. 3A and 3B. In some embodiments, the second dielectric layer 174 comprises a thickness in a range between about 150 Å and about 450 Å. After the second dielectric layer 174 is deposited, a chemical mechanical polish (CMP) can be applied to planarize a top surface of the second dielectric layer 174.

Figure 8:
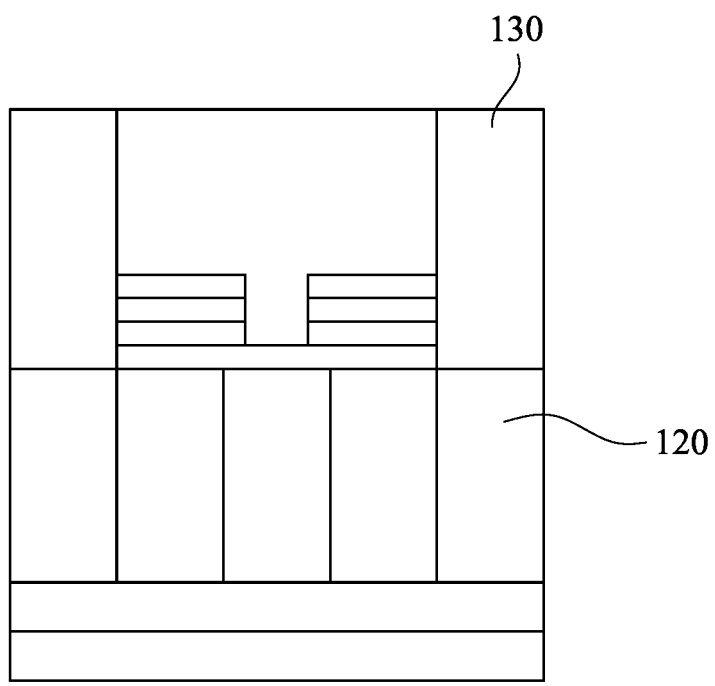

Referring to FIGS. 2 and 8, the method 1000 proceeds to step 1014 by forming a second source/drain contact 130 over and electrically connected to the first source/drain contact 120. As shown in FIG. 8, a via hole (not shown) right above the first source/drain contact is formed first by a lithography process and followed by depositing a conductive material in the via hole to form the second source/drain contact 130 electrically connected to the first source/drain contact 120. In the embodiment, the second source/drain contact 130 is made of a material as same as the first source/drain contact 120, thus the first source/drain contact 120 and the second source/drain contact 130 can be seemed as a single source/drain contact. In other embodiments, the second source/drain contact 130 may comprise a material different from the material of the first source/drain contact 120. It should be noticed that the composite barrier structure 160 is now located over the gate structure 140 and around the second source/drain contact 130.

After the FinFET device 100 with a composite barrier structure 160 over the etch stop layer 150 and between the second source/drain contact 130 and the gate structure 140 is formed, a subsequent process is performed to form a contact over and electrically connected to the second source/drain contact 130 to lead out currents from the source/drain region to an external device.

Referring to FIG. 9, a third dielectric layer 176 is formed over a top surface of the second dielectric layer 174 and the second source/drain contact 130, followed by a contact etching that etches the third dielectric layer 176, the second dielectric layer 174, a portion of the composite barrier structure 160 to form a via hole 198 exposing a portion of a top surface and sidewalls of the second source/drain contact 130. In the embodiment, the forming method and the material of the third dielectric layer 176 is similar to the second dielectric layer 174 mentioned before. It should be noticed that the aforementioned etching loading effects, such as a shifted overlap between the via hole 198 and the second source/drain contact 130, a shrinkage of the second source/drain contact 130, and a large critical dimension (CD) of the via hole 198, usually cause edges of the via hole 198 exceed edges of the second source/drain contact 130.

As illustrated in FIG. 9, before the contact etching, a lithography process is performed to form a photo resist mask 186 over the third dielectric layer 176 to define a position of the via hole 198 and a contact formed afterward. However, the etching loading effects largely decrease the precision of position of the photo resist mask 186 so that the subsequently formed via hole 198 always expose not only a top surface but also the sidewalls of the second source/drain contact 130. In addition, in a traditional FinFET device without the composite barrier structure 160, during forming the via hole 198, the etch stop layer 150 and the first dielectric layer 172 may be over-etched to expose the gate structure 140, thus leading to a short circuit between the gate structure 140 and the second source/drain contact 130 after the via hole 198 is filled with a conductive material to form a contact.

However, the FinFET device in the present disclosure with the composite barrier structure 160 can prevent the via hole 198 from exposing the gate structure 140. Indeed, as shown in FIG. 9, the contact etching is stopped in the composite barrier structure, namely, the a bottom surface of the via hole 198 is located in the composite barrier structure 160). To be more precise, the bottom surface of the via hole 198 is located in the second nitride layer 164. In other embodiments, the bottom surface of the via hole 198 is located in the oxide layer 162. In yet other embodiments, the bottom surface of the via hole 198 is located in the second nitride layer 166.

Referring to FIG. 10, a contact 200 is formed in the via hole 198, wherein the contact 200 is over and electrically connected to the second source/drain contact 130. The forming method and the material of the contact 200 are similar to the second source/drain contact 130 mentioned before. Similarly, the contact 200 comprises either a same or a different material of the second source/drain contact 130. It should be noticed that the contact 200 in the present disclosure will not form a current pathway between the gate structure 140 and the second source/drain contact 130. Instead, in the embodiment, the contact 200 does not reach or expose the etch stop layer 150.

In another embodiment, different from the FinFET device 100 in FIG. 8, the composite barrier structure 160 in the FinFET device 300 (FIG. 11) is apart from the second source/drain contact 130, namely, the composite barrier structure 160 is separated from the second source/drain contact 130 by a part of the second dielectric layer 174. It can be achieved by adjusting the position of the photo resist mask 182 and the subsequently formed first via hole 192 in FIG. 6.

In another embodiment, different from the FinFET device 100 in FIG. 8, the composite barrier structure 160 in the FinFET device 400 (FIG. 12) does not cover the gate structure 140. It can be achieved by adjusting the position of the photo resist mask 182 and the subsequently formed second via hole 194 in FIG. 6.

In another embodiment, different from the FinFET device 100 in FIG. 8, the composite barrier structure 160 in the FinFET device 500 (FIG. 13) covers all the gate structure 140. It can be achieved by adjusting the position of the photo resist mask 182 to form only the first via hole 192 without the second via hole 194 as shown in FIG. 6.

As aforementioned, a method for manufacturing a FinFET device with a composite barrier structure over an etch stop layer (or called contact etch stop layer) is very important for improving electrical performance and stability of a semiconductor device. It is known that in a traditional way to form a contact, a via hole adjacent to and exposing a source/drain contact is formed first by a contact etching process. However, due to the aforementioned etching loading effects, edges of the via hole usually exceeds edges of the source/drain contact. Furthermore, the etch stop layer (i.e. the contact etch stop layer) over the gate structure is unable to prevent the via hole from penetrating through itself once an over-etching situation and the etching loading effects occur. Thus, the formed via hole exposes not only the source/drain contact but also the gate structure, which may lead to a short circuit between the source/drain contact and the gate structure after depositing a conductive material into the via hole to form the contact. Hence, a method is needed for preventing the aforementioned short circuit from occurring.

A method disclosed according to the embodiments to solve the problem described above related to the short circuit caused by the via hole exposing both the gate structure and the source/drain contact is forming a composite barrier structure (or called diffusion barrier layer) over the etch stop layer (i.e. contact etch stop layer) to provide a better protection for the gate structure. During the contact etching process, by forming the composite barrier structure, the contact etching can be stopped in the composite barrier structure (i.e. the via hole is ended in the composite barrier structure) without penetrating the contact etch stop layer and exposing the gate structure, thus a short circuit problem between the gate structure and the second source/drain contact in a traditional FinFET device can be solved.

In accordance with some embodiments of the present disclosure, a semiconductor device is provided. The semiconductor device includes a transistor over a substrate, a passivation layer overlying the transistor, and a diffusion barrier layer over the passivation layer. The transistor includes a gate structure across over a fin structure and source/drain regions within the fin structure and adjacent to the gate structure. The semiconductor device further includes source/drain contacts extending through the diffusion barrier layer and the passivation layer to be electrically connected to the source/drain regions.

In accordance with some embodiments of the present disclosure, a semiconductor device is provided. The semiconductor device includes a transistor over a substrate and a composite barrier structure over the transistor. The transistor includes a gate structure across over a fin structure and source/drain regions within the fin structure and adjacent to the gate structure. The composite barrier structure includes multiple etch-stop layers. The semiconductor device further includes source/drain contacts penetrating through the composite barrier structure and electrically connected to the source/drain regions.

In accordance with some embodiments of the present disclosure, a method for manufacturing a semiconductor device is provided. The method comprises a series of steps including: forming a transistor having source/drain regions within a fin structure and adjacent to a gate structure across over the fin structure; forming first source/drain contacts right above and electrically connected to the source/drain regions; depositing a composite barrier structure over the transistor and the first source/drain contacts; and forming second source/drain contacts right above and electrically connected to the first source/drain contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a transistor, comprising:
      a first source/drain region;
      a second source/drain region; and
      a gate structure between the first source/drain region and the second source/drain region;
   a composite barrier structure comprising multiple etch-stop layers, wherein each of the multiple etch-stop layers at least partially covers the transistor;
   a dielectric layer overlying the composite barrier structure; and
   a first source/drain contact laterally adjacent the composite barrier structure and electrically connected to the first source/drain region.

2. The semiconductor device of claim 1, wherein the first source/drain contact is in contact with a sidewall of one or more of the multiple etch-stop layers.

3. The semiconductor device of claim 1, wherein the first source/drain contact is in contact with a sidewall of each of the multiple etch-stop layers.

4. The semiconductor device of claim 1, comprising a passivation layer at least partially overlying the gate structure.

5. The semiconductor device of claim 4, wherein the first source/drain contact is in contact with a sidewall of the passivation layer and a sidewall of one or more of the multiple etch-stop layers.

6. The semiconductor device of claim 1, wherein a first portion of the composite barrier structure is spaced apart from a second portion of the composite barrier structure by the dielectric layer.

7. The semiconductor device of claim 1, comprising a passivation layer at least partially overlying the gate structure, wherein the dielectric layer is in contact with a top surface of the passivation layer.

8. The semiconductor device of claim 1, wherein the first source/drain region and the second source/drain region are within a fin structure and the gate structure is over the fin structure.

9. The semiconductor device of claim 1, comprising a second source/drain contact laterally adjacent the gate structure, wherein an interface is defined where the first source/drain contact contacts the second source/drain contact.

10. The semiconductor device of claim 9, comprising a second dielectric layer between the second source/drain contact and the gate structure.

11. The semiconductor device of claim 1, wherein the composite barrier structure overlies a portion of the gate structure.

12. The semiconductor device of claim 1, wherein the multiple etch-stop layers comprise a nitride layer and an oxide layer.

13. A semiconductor device, comprising:
   a transistor, comprising:
      a first source/drain region;
      a second source/drain region; and
      a gate structure between the first source/drain region and the second source/drain region;
   a passivation layer at least partially overlying the gate structure;
   a composite barrier structure comprising multiple etch-stop layers, wherein each of the multiple etch-stop layers at least partially covers the transistor; and
   a first source/drain contact laterally adjacent the composite barrier structure and electrically connected to the first source/drain region.

14. The semiconductor device of claim 13, comprising a second source/drain contact laterally adjacent the gate structure, wherein an interface is defined where the first source/drain contact directly contacts the second source/drain contact.

15. The semiconductor device of claim 14, comprising a dielectric layer between the second source/drain contact and the gate structure, wherein the dielectric layer underlies the composite barrier structure.

16. The semiconductor device of claim 13, wherein the composite barrier structure at least partially covers the gate structure.

17. A semiconductor device, comprising:
   a transistor, comprising:
      a fin
      a gate structure over the fin;
   a composite barrier structure comprising multiple etch-stop layers, wherein each of the multiple etch-stop layers at least partially covers the transistor;
   a dielectric layer overlying the composite barrier structure; and
   a first source/drain contact laterally adjacent the composite barrier structure and electrically connected to a first source/drain region of the fin.

18. The semiconductor device of claim 17, comprising:
   a passivation layer at least partially overlying the gate structure.

19. The semiconductor device of claim 17, wherein the dielectric layer is in contact with a top surface of the passivation layer.

20. The semiconductor device of claim 17, wherein each of the multiple etch-stop layers at least partially overlies the gate structure.

* * * * *